US007737869B2

(12) United States Patent
Monro

(10) Patent No.: US 7,737,869 B2
(45) Date of Patent: Jun. 15, 2010

(54) SYMBOL BASED DATA COMPRESSION

(76) Inventor: Donald M. Monro, 6, The Lays, Goose Street, Beckington, Somerset (GB) BA11 6RS ( * ) Notice: Subject to any disclaimer, the term of this patent is extended or adjusted under 35 U.S.C. 154(b) by 390 days.

(21) Appl. No.: 11/777,130

(22) Filed: Jul. 12, 2007

(65) Prior Publication Data

US 2009/0019070 A1    Jan. 15, 2009

(51) Int. Cl.
*H03M 7/34* (2006.01)
*H03M 7/38* (2006.01)

(52) U.S. Cl. .............................. 341/51; 341/50; 341/87

(58) Field of Classification Search ................. 341/51
See application file for complete search history.

(56) References Cited

U.S. PATENT DOCUMENTS

| 4,168,513 | A |   | 9/1979  | Hains et al.   |        |
|-----------|---|---|---------|----------------|--------|
| 4,509,038 | A |   | 4/1985  | Hirano         |        |
| 5,635,932 | A |   | 6/1997  | Shinagawa et al.|       |
| 5,748,786 | A |   | 5/1998  | Zandi et al.   |        |
| 5,768,437 | A |   | 6/1998  | Monro et al.   |        |
| 6,037,883 | A | * | 3/2000  | Forbes ........ | 341/51 |
| 6,078,619 | A |   | 6/2000  | Monro et al.   |        |
| 6,549,148 | B2|   | 4/2003  | Satoh          |        |
| 6,556,719 | B1|   | 4/2003  | Monro          |        |
| 6,563,438 | B2|   | 5/2003  | Satoh          |        |
| 6,707,400 | B2| * | 3/2004  | Christofferson et al. ..... 341/106 |
| 6,714,147 | B2|   | 3/2004  | Huber et al.   |        |
| 6,990,145 | B2|   | 1/2006  | Monro et al.   |        |
| 7,310,055 | B2|   | 12/2007 | Odagiri        |        |
| 7,352,298 | B2| * | 4/2008  | Monro ........ | 341/51 |
| 2004/0126018 | A1 | | 7/2004 | Monro         |        |
| 2004/0165737 | A1 | | 8/2004 | Monro         |        |

FOREIGN PATENT DOCUMENTS

| WO | WO 99/08449    | 2/1999  |
| WO | WO 01/63935    | 8/2001  |
| WO | WO 2005/027049 | 3/2005  |
| WO | WO 2007/149383 | 12/2007 |

OTHER PUBLICATIONS

Zhang et al, "A Rate Estimation Framework for Matching Pursuits Video Coding," Journal of Multimedia, pp. 36-45, vol. 2, No. 3, Academy Publisher, Jun. 2007.
International Search Report and Written Opinion for PCT/US2008/069535 mailed Jun. 10, 2009.
Office Action for U.S. Appl. No. 12/392,223, mailed Sep. 14, 2009.

* cited by examiner

*Primary Examiner*—Khai M Nguyen

(57) ABSTRACT

Briefly, within a computer or digital data processing system, embodiments describe a method, article and apparatus for compressing data is described, which may be used for communicating between two or more components connected to an interconnection medium (e.g., a bus) within a single computer or digital data processing system, and/or for communicating between two or more computers or digital data processing systems via an interconnection medium such as a network.

38 Claims, 4 Drawing Sheets

SYMBOL BASED DATA COMPRESSION

FIELD

The present patent application is related to data compression, and, within a computer or digital data processing system, processes or apparatus for communicating between two or more components connected to an interconnection medium (e.g., a bus) within a single computer or digital data processing system. Subject matter disclosed herein may also relate to processes or apparatus for transferring data from one computer or digital processing system to another computer or digital processing system via a network or other interconnection medium.

BACKGROUND

In recent years it has become more and more common for persons to share data over networks; however, transmission of data has a cost in terms of bandwidth utilization. Therefore, large amounts of data, for example, are often compressed. Compression may also be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference to the following detailed description if read with the accompanying drawings in which:

DETAILED DESCRIPTION

Figure 1:
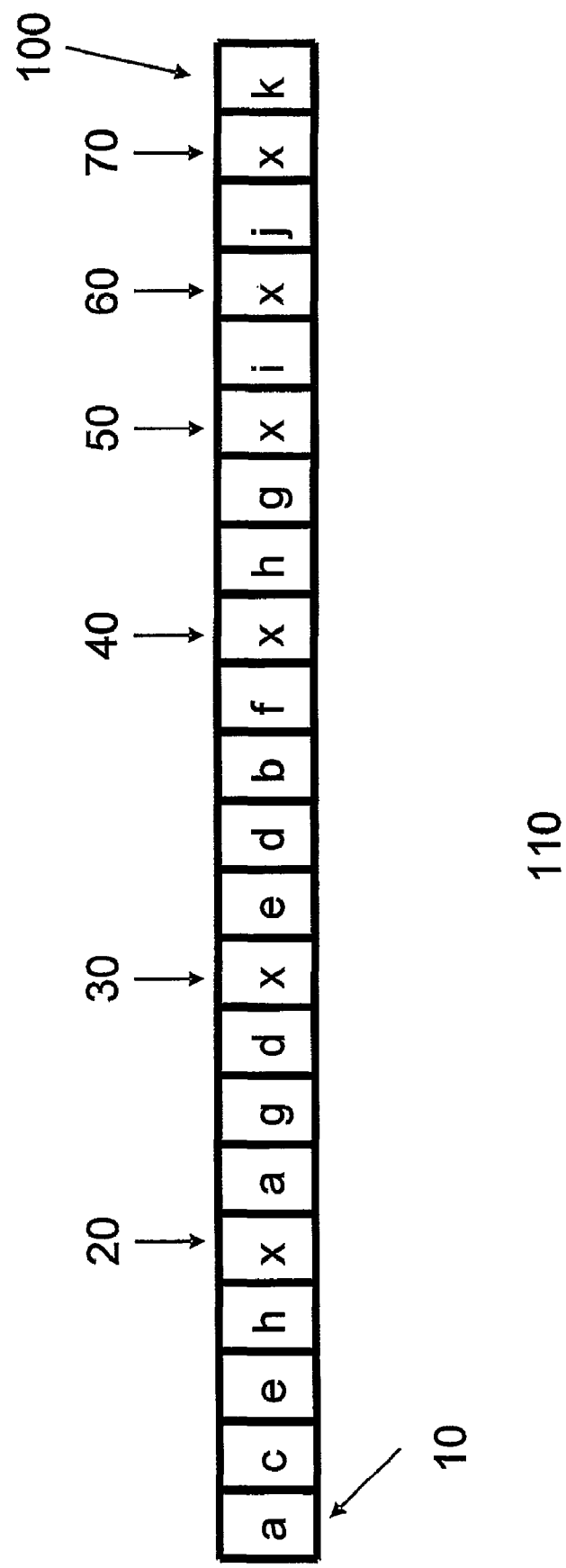
FIG. 1 is a schematic diagram illustrating one example embodiment in accordance with claimed subject matter.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Although claimed subject matter is not limited in scope in this respect, one particular embodiment of a method of compressing data is described hereinafter. A symbol string may be selected that occurs within a set or grouping of data to be compressed. A symbol string code may be generated indicative of one or more positions of the symbol string within the data. A particular symbol string code may indicate the end of a symbol string group, indicating that a new symbol string is to be selected and coded. Alternatively or in addition, a particular symbol string code may indicate that one or more other symbol strings are to be jumped, or skipped over, before selecting a coding a further symbol string. Alternatively or in addition, a further symbol string code may carry the position beyond the end of the data, indicating that a new symbol string is to be selected and coded, the first position of which is determined at least in part based upon the number of positions beyond the end of the data. Likewise, for further symbol strings within the data, this may be repeated. Respective symbol string codes may then be combined to form a data code. A resulting data code may comprise a compressed form of the set or grouping of data. This data code may be transmitted or stored as desired.

Although claimed subject matter is not limited to this embodiment, one particular embodiment may be carried out by compressing data according to "Multipass Embedded Residual Group Encoding" ("MERGE") data compression methods, as described below. The MERGE data compression method may include variations which may be used for varying types of data. For example, the MERGE data compression method may generate a symbol string code indicative of one or more positions of the symbol string within the data. A particular symbol string code may indicate the end of a symbol string group, indicating that a new symbol string is to be selected and coded. Alternatively or in addition, the MERGE data compression method may employ a particular symbol string code indicative that one or more other symbol strings are to be jumped, or skipped over, before selecting a further symbol string for coding. This variation of MERGE compression may be desirable for sparse or non-uniform data where there exist empty data groups; however, it may be used for other types of data as well. Alternatively or in addition, the MERGE data compression method may generate a further symbol string code that may carry the position beyond the end of the data, indicating that a new symbol string is to be selected and coded, the first position of which is determined at least in part based upon the number of positions beyond the end of the data. This "wraparound" variation may be advantageous to achieve further data compression for some applications; however it may used for all data as well. In this manner, the MERGE data compression method provides adaptive coding, which may be useful where the coder detects changes in the data distribution. In this embodiment, a MERGE coder may be capable of accomplishing these coding variations or separate MERGE coders may be employed, each capable of accomplishing one or more coding variations. In this embodiment, a decoder may be used which is capable of decoding data coded according to all variations. However, claimed subject matter is not intended to be limited to any particular embodiment, as there are other embodiments possible for carrying out the claimed subject matter.

One particular embodiment may be carried out by successively identifying positions at which a selected symbol string occurs, determining distances between occurrences of the selected symbol string, and generating a code including distances representing the positions of the selected string within the data, although claimed subject matter is not limited in scope in this respect.

A particular symbol string code may indicate the end of a symbol string group, indicating that a new symbol string is to be selected and coded. Alternatively or in addition, a particular symbol string code may indicate that one or more other symbol strings are to be jumped, or skipped over, before selecting a coding a further symbol string. Alternatively or in addition, a position beyond the end of the data may indicate that a new symbol string is to be selected, whose first position is indicated by the distance of the position beyond the end of data. The distance could be large enough that it wraps around more than once. Likewise, here, symbols may comprise any type, form or format of data. For example, this may include records, files, sectors, clusters, groupings and/or portions thereof. Furthermore, symbols may comprise words, bytes, bits, text, characters and/or the like. Symbol strings may comprise single or multiple symbols. Likewise, they may be fixed or variable in length.

For one particular embodiment, symbol strings may be coded in a particular or a predetermined order, although, again, this is merely an example embodiment and claimed subject matter is not limited in scope in this respect. Alternatively or in addition, rather than coding in an order, symbol strings may be coded in any order. In such an embodiment a symbol string code may be prefixed by some other code indicative of the particular symbol string, for example, although claimed subject matter is of course not limited in scope to this example embodiment. Likewise, for one particular embodiment, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

In one embodiment, if a symbol string includes repetitions of a symbol string, a symbol string code may include data which indicates presence of a run of occurrences of the symbol string. Storage or transmission of data indicative of a run of occurrences may be more efficient from a compression standpoint than sending such occurrences individually. In one particular embodiment, positions may be signalled by run length coding, but other coding methods are also possible instead or in addition, as described in more detail below. Likewise, coding may be context dependent at least in part. If a length of a set or grouping of data to be coded is known in advance, for example, it may be prefixed to a first symbol string code. Depending at least in part on the particulars of an embodiment, positions of a final symbol string may be determined without transmission or storage of additional information corresponding to that particular symbol string, again as described in more detail below.

However, in another embodiment, the position of the symbol string may be signalled by indicating where it does not occur, although, again, this is merely an example embodiment and claimed subject matter is not limited in scope in this respect. For example, by sending the distance between occurrences and ignoring what might actually lie in between.

If a symbol string occurs infrequently, a symbol string code may include data which indicates a run of positions or vacancies where the symbol string does not occur. Storage or transmission of data indicative of a run of vacancies may typically be more efficient from a compression standpoint than sending such occurrences individually. In one particular embodiment, vacancies may be signalled by run length coding, but other coding methods are also possible instead or in addition, as described in more detail below. Likewise, coding may be context dependent at least in part. If a length of a set or grouping of data to be coded is known in advance, for example, it may be prefixed to a first symbol string code. Depending at least in part on the particulars of an embodiment, positions of a final symbol string may be determined without transmission or storage of additional information corresponding to that particular symbol string, again as described in more detail below.

Furthermore, side or additional information about all or some symbol strings may also be included in a data code. In one particular embodiment, additional information relating to a particular symbol string may be sent at the end of or otherwise associated with a corresponding symbol string code. Alternatively, additional information may be sent or stored after sending or storing symbol string codes. More generally, additional information may be provided at any time or in any manner so that a decoder is capable of associating that information with a corresponding symbol string. A list or table of symbol strings to be used may be predetermined or predefined, for example. Alternatively or in addition, it may be compiled based at least in part on symbol strings which occur in data to be compressed, for example.

After symbol string codes for a particular set or grouping of data have been stored or transmitted, an end code may be used. After positions of symbol strings present in a set of data, except a final symbol string, have been stored or communicated, positions of the final symbol string may, in at least some embodiments, be determined. Hence, an encoder may omit storing or communicating positions of such a final symbol string, as described in more detail hereinafter.

In one approach, it is shown how the end code may be avoided. As is known in the field, it may be beneficial to reduce the number of symbols used in forming a code, so eliminating the symbol used to indicate the end of a group may result in improved compression. This may be useful when the data is such that most symbol strings occur, and the distribution of any given symbol string throughout the data is relatively uniform, i.e. there is no bias towards the beginning or end of the data.

However in other circumstances, such as to code sparse or non-uniformly distributed data, an additional end code may be used to advantage when the data is sufficiently sparse that many symbol string groups are empty, i.e. the data contains no instances of particular symbol string codes. In this sense, rather than coding empty groups of data, this second end code may direct the coder to jump or skip over the empty groups, to the next data to be coded. In this manner, use of the second end code may result in further data compression.

Embodiments covered by claimed subject matter include, for example, a computer program capable of implementing any such method, and/or a computer system capable of implementing such a method. Embodiments also include a hardware and/or software coder capable of carrying out a method as described below in combination with a hardware and/or software decoder capable of reconstructing an original set or grouping of data from a data code representing a compression of such data. These as well as many other embodiments are intended to be within the scope of claimed subject matter.

In this particular context, any grouping, set or portion of associated data to be compressed may be treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data could be used, which may or may not fit within a byte or digital word length, for example. If data is represented in binary form, a symbol may be represented, depending on the particular embodiment, as a single bit or multiple bits of fixed or variable length.

Data, such as stored as a file, a record or other unitary association of data, as one example, might be treated as a whole, or instead partitioned or divided into convenient lengths, long enough for symbol groupings, referred to here as symbol strings, to be coded with some amount of compression efficiency, but short enough to be conveniently processed. Various approaches are described in more detail below.

Initially, for example, in an embodiment, a list or table of symbol strings that may occur within a set of data is established. Added to this list might be an initial list of symbol strings based at least in part on a priori knowledge or information regarding statistics for the data. For example, for text, a common symbol string might comprise "ee", frequently occurring words such as "and" or "or", or a punctuation symbol followed by a blank, to provide some simple examples. Of course, claimed subject matter is not limited in scope to these examples or to this particular embodiment. Many possible variations are also intended to be included within the scope of claimed subject matter.

A particular set of data, as another example, may be examined before coding begins to identify symbol strings that occur commonly. Alternatively, or in addition, if partitioning is applied, these partitions, for example, may be handled separately or independently using an initial list of symbol strings. This initial list may be determined, for example, at least in part from symbol strings which may have been found in earlier data partitions, for example.

Alternatively, symbol strings may be added as coding proceeds, as occurs in Lempel-Ziv-Welsh coding, as an example. However, in this embodiment example, coding symbol strings, as described below, is quite different from the approach used in LZW coding. In LZW, a symbol string is coded by substitution of another, longer symbol or string. For that reason, LZW may, at times, not compress sets of data and, in some cases, may produce longer sets of data. In contrast, embodiments in accordance with claimed subject matter will likely result in compression, as described in more detail hereinafter.

To compress a grouping or a set of data, a first symbol string may be selected from a list of available symbol strings. Occurrences of that string in the data may be located. Positions of the first symbol string within the data may be retained. This process may be then repeated for additional symbol strings for the data so as to specify the set or grouping. Data comprising symbol strings may be processed in any order, although sequentially from beginning to end of the set or grouping of data may be one convenient approach.

Typically, coding is carried out by a hardware or software coder. In one possible embodiment, a coder may be arranged to transmit data, after being coded, across a communications channel to a decoder which may be arranged, in real time or otherwise, to use received coded data to reconstruct the set of data.

Again, claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 1. FIG. 1 is a schematic diagram of an example embodiment in accordance with claimed subject matter.

In the example of FIG. 1, one line of text 110 is illustrated to represent a set or grouping of data. Likewise, a symbol string, here, the letter "x," will be processed in this example. Of course, claimed subject matter is not limited to this example embodiment or to any one particular embodiment. This example is simply an illustration for explanatory purposes. Many other potential embodiments are intended to be included within the scope of claimed subject matter.

Starting at a location, referred to here as "start," designated in FIG. 1 as 10, text data 110 is searched sequentially in this example. Of course, claimed subject matter is not limited to sequential searching, as mentioned previously, above. Nonetheless, if an occurrence of a selected symbol string, here, again, "x," is found, information about the occurrence, such as, in this example, its location, may be retained. In the example shown, the first occurrence of the string "x" occurs in the $5^{th}$ position after start position 10, as is indicated by reference numeral 20. Symbol string "x" is again at position nine after the start, or four positions further on from the preceding one, as is indicated by reference numeral 30.

Continuing with the example, "x" occurs again five positions later, after the preceding one, as shown by reference numeral 40. Subsequent positional spacing is 3, 2, 2, as respectively shown by reference numerals 50, 60, 70.

In this example, it is shown how the coder has a choice of different coding variations, which may be useful for coding particular different types of data.

In this example, once text data 10 has been fully parsed in this way to an "end" position, here 100, a code representative of positions in the portion of the set of data may be generated by storing or transmitting this code. Though, a code representative of positions in the portion of the set of data may also be generated without storing or transmitting this code in other embodiments. In this particular embodiment, in effect, positions at which x does not occur are stored or signalled. In this context, this is referred to as run length coding. Here, "runs" of positions not containing x are coded.

In the simple example embodiment of FIG. 1, data comprises a line of text and the symbol string comprises a letter. In variants of this within the scope of claimed subject matter, occurrences of more lengthy and/or complex symbol strings may be sought. As described in more detail below, these may comprise symbol strings having a fixed, predefined form, or alternatively, may comprise symbol strings having flexibility, such as, in form, length, and/or composition, for example. The extent of flexibility may be predefined or it may be calculated with some dependence at least in part upon some characteristic or characteristics of the data. Some further example symbol strings are set out below.

- Any letter, symbol or character a, such as "x". This could in principle include a single symbol position.
- Any bigraph $a_1 a_2$, such as "st".
- Any combination $a_1 a_2 a_3$, such as "str".
- Any longer combination $a_1 a_2 a_3 \ldots a_n$, such as "st_ _ng" where the underscores represent single symbol positions.

For an embodiment, once positions of a first symbol string have been determined, positions of a second symbol string in a list of possible or known symbol strings may be determined.

In this embodiment, a further run of positions not occupied by either symbol may be sent which carries the position beyond the end of the data and by starting again at the beginning moves forward to the first position of the second symbol string. More detail is given in examples which follow. The coding of positions may or may not skip over positions whose symbols are already known as explained in more detail in the examples below.

Gradually, in this manner, a set of data may be coded. As coding proceeds, a coder may transmit to a decoder information about symbol strings that have been located, such as position(s), in real time for some embodiments. Alternatively, coded data may be stored locally as a compressed representation.

The example embodiment may be expressed in pseudo-code as follows:

```
For S = Symbol Strings
    Indicate positions of S in a set of data
End
```

As a further example, consider a short sequence S of 8 symbol strings S1 to S8. For purposes of illustration, symbol strings here comprise a fragment of text, although claimed subject matter is not limited in scope in this respect. Such fragments are short and, furthermore, symbol strings may not comprise text at all and still be within the scope of claimed subject matter. A space between the two words also comprises a symbol string in this example, as illustrated below:

S: 'the test'

| S1 | S2 | S3 | S4 | S5 | S6 | S7 | S8 |
|----|----|----|----|----|----|----|----|
| t  | h  | e  | 'space' | t | e | s | t |

Deliberately, in this example, the letters chosen are common ones to occur in English language text.

In this example, positions of a symbol string may be indicated by any convenient approach. A convenient approach to communication or transmit positions may comprise plain numerals. A set of symbol strings may be evaluated with respect to a set of data in some order. Suppose, for the purpose of illustration, as an example, symbol strings here have order 'e' 't' 'a' 'o' 'i' 'n' 's' 'h' 'r' 'd' 'space' 'l' 'u'. Apart from the position assigned to 'space,' this example order generally corresponds to the frequency of the letters normally encountered in English language text. Suppose that in this example, after 'space' there are a further 16 letters to consider, of which only the first two are shown here. Although, of course, claimed subject matter is not limited in scope to this example or to any particular example. Nonetheless, for this example, the following symbol strings may be communicated or stored as follows:

| 3 6 | 1 5 8 | 7 | 2 | 4 |
|-----|-------|---|---|---|
| Scan for e | Scan for t | Scan for s | Scan for h | Scan for 'space' |

In the above, 3 and 6 indicate the position of symbol string 'e'; 1, 5 and 8 indicate the position of 't' and so on.

For this particular embodiment, a technique may be used advantageously to indicate no additional information for a particular symbol string is communicated or stored. In an embodiment, this may be accomplished by defining a special symbol for Plain End Of Group (EOG-P). This would give, for this example embodiment an incomplete code:

| 3 6 EOG-P | 1 5 8 EOG-P | 7 EOG-P | 2 EOG-P | 4 EOG-P |
|-----------|-------------|---------|---------|---------|
| Scan for e | Scan for t | Scan for s | Scan for h | Scan for 'space' |

In this example, coding begins with 'e', as would be known to both coder and decoder. After the first EOG-P, both coder and decoder know that they consider the positions of the letter 't', which is the next symbol string in sequence. However, after coding 't' the coder should next consider 'a' based upon the order set out above, but there are no occurrences of 'a' in the data. In fact, in this data, there are empty groups: 'a', 'i', 'o' and 'n' before coding 's'. One way to account for the empty groups would be to send a further four EOG-P symbols, one for each empty group. In that sense, the empty groups may be coded in the same manner as the populated groups, but since they do not have positions of data, no position information is sent with the EOG-P code for an empty group. Thus, is this example method, an EOG-P code without position information for a group, indicates a jump or skip over that particular data. Continuing on with the data in this example, fortunately a populated group, 'h' follows immediately after 's,' but then the groups for 'r' and 'd' are empty. Finally after coding 'space', there are 16 further empty groups to the end of the alphabet. The complete code, if coding with the populated and empty groups treated in the same manner, may be:

| 3 6 EOG-P  | 1 5 8 EOG-P | EOG-P EOG-P EOG-P EOG-P | 7 EOG-P  | 2 EOG-P  | EOG-P EOG-P  | 4 EOG-P      |
|------------|-------------|-------------------------|----------|----------|--------------|--------------|
| Scan for e | Scan for t  | Jump 'a'-'i'-'o'-'n'    | Scan 's' | Scan 'h' | Jump 'r'-'d' | Scan 'space' | plus 16 further EOG-P symbols to end alphabet

Coding EOG-P for the empty groups may be a wasteful use of EOG-P in this example.

One manner of reducing or attempting to eliminate this wasteful use of EOG-P, is with the following embodiment; though claimed subject matter is not intended to be limited to any particular embodiment as variations and modifications are possible within the scope and spirit of the claims. In this embodiment, one manner of further compressing the data in this example may be by using a second end symbol for Jumping End of Group (EOG-J). In this embodiment, each EOG-J code may be followed immediately by a code indicating how many symbol strings are to be jumped. However, in other embodiments, it may possible to employ EOG-J codes without an integer code. For example, in instances where EOG-J is used to jump over one group. The Jumping EOG symbol may give improved flexibility in dealing with data where symbol string groups may be empty, i.e. contain no occurrences. For example, to end the current symbol string group and jump over the four next symbol string groups which may be empty, the coder in this embodiment may use the symbols:

EOG-J 4

Applying this method to the example data may give:

| 3 6 EOG-P  | 1 5 8 EOG-J 4     | 7 EOG-P  | 2 EOG-J 2     | 4 EOG-J 16           |
|------------|-------------------|----------|---------------|----------------------|
| Scan for e | Scan for t Jump   | Scan 's' | Scan 'h' Jump | Scan 'space'<br>Jump |

In some embodiments, the EOG-J symbol might be used in a situation where there are no empty symbol string groups. In an embodiment, this could be communicated by sending EOG-J followed by the code for 0. (This would have the same effect as sending just EOG-P.) However, it can happen at some stage in using an adaptive coder that the codes for EOG-J plus '0' are together shorter than the code for EOG-P. A coder taking a short term view might choose to send EOG-J 0. However, doing so might affect the longer term compression of the coder, by reducing the frequency of occurrence of EOG-P and preventing the coding process from adjusting the length of EOG-P. Repeatedly using EOG-J 0 in place of EOG-P might eventually result in EOG-P having a longer code than it would otherwise have, and this may not be advantageous. Thus, in some circumstances, it may be best in the design of a coder to avoid the use of EOG-J followed by 0.

Another possibility for some embodiments, is that EOG-J may be followed by a negative number causing it to jump backwards through the order of symbol strings. It is possible in a very sophisticated coder that some advantage might be gained by this. For example the total length of jumps might be reduced by devising a complicated revision of a predetermined order of symbol strings. Or as another example, it might occur that multiple data items occupy the same position so that the coder could decide to revisit a group.

In some embodiments, in general, in applications where data is sparse, there may be many empty symbol string groups, and it can be wasteful to send a long sequence of the EOG-P end codes to indicate the successive ends of empty symbol string groups. Instead of employing the EOG-J code discussed above, it may sometimes be appropriate to simply wrap the positions round, starting a new scan with a new symbol string as soon as a previous symbol string grouping is completed. This wraparound method will be described in greater detail below. In that way the EOG-P symbol could be eliminated completely for suitable non-sparse data with symbol strings more or less uniformly distributed evenly through the data. It is also possible to employ both the wraparound and jump coding for different symbol strings, such that the EOG-P code is eliminated and data either wraps around or jumps, by using the EOG-J code. It would also be possible to use the 'wraparound' method to jump over a number of successive symbol string groups. However, in general, this may involve coding a long run length which is likely to be of an unusual length and so could disrupt the probability distribution of the normal spacing of the data and adversely affect the coding performance. In the above example, 'wrapping' around from the end of 't' to the first code in 's' would involve signalling a position of 39 for 's' which would be interpreted as the integer part of (39/8), i.e. 4 wraps plus the remainder of 39 after division by 8, i.e. position 7 for 's'.

Alternatively, as shown above, in some embodiments, an additional symbol may be introduced which may be used whenever an EOG-P would be followed by one or more empty symbol string groups. In this case the new 'Jumping EOG', or EOG-J may be used to indicate that there are empty symbol string groups, followed by a code indicating how many symbol string groups are to be jumped. This may be appropriate where data is sparse, i.e. when certain symbol strings that are provided for do not occur, or in the early stages of bit plane coding of transformed data such as might arise for example in the early passes in bit plane coding of wavelet coefficients as will be familiar to those experienced in the field of wavelet compression. Another feature of transform coding often encountered is that certain groupings of coefficients, such as low frequency coefficients, are much more likely to occur than high frequency coefficients. In these and other situations the 'wraparound' code may be inappropriate and instead the use of EOG-P in combination with the EOG-J introduced here may give better compression despite the introduction of additional symbols.

More efficient coding of position may be desired than that shown in the above example. For example, with eight positions, 3 bits per symbol string may be employed to communicate position this by a conventional coding method, quite apart from communicating an EOG.

To improve compression efficiency, Run Length Coding (RLC) may be applied to the positions of successive symbol strings. However, any form or type of coding to code the length of a run might be used and claimed subject matter is not limited to a particular form or type. For example, a Golomb coder, or a binary arithmetic coder might be employed, to provide a few examples. These coders may be employed, for example, to code a succession of 0's and 1's that indicate one or more positions in a set of data where a symbol string does not and does occur (or vice versa). Of course, these are simply examples and claimed subject matter is not limited in scope to such examples. Many other possible approaches to coding the length of runs are contemplated and included within the scope of claimed subject matter.

Nonetheless, continuing with this example, in such an embodiment the positions of a symbol string may be run length coded. In this case, for example, instead of coding 3 followed by 6 to indicate positions of symbol string 'e', one may code a 2 to indicate that 2 positions are skipped before the first occurrence of 'e', 2 to indicate that two further positions are skipped to get from position 3 to position 6, and so on:

| 2 2 EOG-P | 0 3 2 EOG-J 4 | 6 EOG-P | 1 EOG-J 2 | 3 EOG-J 16 |
|---|---|---|---|---|
| Scan for e | Scan for t | Scan for s | Scan for h | Scan for 'space' |

This provides compression by involving the 9 symbols 0, 1, 2, 3, 4, 6 and 16, in addition to EOG-P and EOG-J, which is a smaller set to code than the 11 symbols 1 to 8, plus 16, EOG-P and EOG-J, without Run Length coding.

Following on from the description of Run Length Coding, it can be seen in more detail how the wraparound method would work in combination with Run Length Coding (RLC). The use of the wraparound method, however, is not to be limited to use with Run Length coding by the examples which follow.

However, to continue the present example, to eliminate the EOG symbol, it is noticed that the final position of 'e' is 6 and the first position of 't' is 1. Coding a run length of 2 following the final 'e' may at first sight seem impractical or impossible because by signalling that position 8 is to be passed, it carries the data to position 9 in a data set that has only 8 positions, but in this example we interpret 9 as being the same as 1, i.e. the beginning of the data which is the first position of 't'. More generally, in this example, whenever we signal a run length r, which causes r+1 to be added to a current position p, knowing that the length of the data is L, we may interpret the new position not simply as p+r+1 but instead as mod (p+r+1, L), i.e. the integer remainder after p+r+1 is divided by L. If p+r+1 is less than or equal to L this is the same as p+r+1. If p+r+1 is greater than L this 'wraps around' back into the data set. In this example, we may assume the 'wrap' re-enters the data once only, but for a large value of r, it might wrap around more than once. For example, this might be used to indicate that one or more symbol strings are to be skipped over in an embodiment where the order of symbol strings is predetermined. For example, a run of 11 after 6 will also move to position 1, but by passing once completely over the data which might indicate that a symbol string is to be jumped. When p+r+1 is greater than L, the number of wraps would be the integer quotient:

$$\text{int}\left(\frac{p+r+1}{L}\right).$$

And the number of symbol strings jumped past or 'passed over' is one less than this, i.e.:

$$\text{int}\left(\frac{p+r+1}{L}\right)-1$$

It should be noted that the new position reached in this example is mod(p+r+1, L) as previously stated. Of course, claimed subject matter is not limited to this example embodiment or to any one particular embodiment. This example is simply an illustration for explanatory purposes. Many other potential embodiments are intended to be included within the scope of claimed subject matter.

We will see below that L may be interpreted differently in another example embodiment of the method.

Continuing with the example, wrapping around multiple times can be seen once the symbol string 't' has been coded. To reach the symbol string 's' the symbols 'a', 'o', 'i', and 'n' have to be jumped past. After coding 't' in position 8, a run of 32 will wrap around 4 times, jumping over the 4 unused symbol strings. The next symbol string, 's' occurs at position 7, so the total run required to wrap from the final 't' to 's' is 32+6, i.e. 38.

The symbol string 'h' occurs then immediately after 's,' so no jumping over symbol strings is required. A run length of 2 carries the position to the location of the only 'h'. After 'h,' to reach the 'space' requires a run of 16 to jump over two unused symbol strings, plus 2 further positions to reach the position of the 'space.' After the 'space' there are 16 symbol strings to skip in this example. This may be a run of 16×8+4, i.e. 132. Though this is possible, it may be an awkward situation for the wraparound method. Methods of avoiding this will be disclosed below.

The exemplary sequence based entirely on wraparound becomes:

| 2 2 | 2 3 2 | 38 | 2 | 18 | 132 |
|---|---|---|---|---|---|
| Scan for e | Scan for t | Scan for s | Scan for h | Scan for 'space' | |

It can be seen that the wrap around code is going to be efficient in situations where it does not jump over empty groups. In the scans for 'e', 't', and 'h' only the symbols for 1, 2 and 3 are used. The codes which simultaneously wrap and jump, 38, 18, and 132 may not be efficient. This suggests that one or other of the EOG-P or EOG-J might be preferred for these jumps.

Thus, in accordance with claimed subject matter, the coder may have a choice of methods to use to move from the completion of coding one symbol string to selecting and coding the next symbol string. Generally, employing either EOG-P or EOG-J or Wraparound for all circumstances is not the most efficient coding method. Rather, a combination thereof may provide better coding efficiency. By allowing the coder to choose any of these three end codes for symbol string groups, a coder can select the method used to suit the particular circumstances. Of course, a corresponding decoder should be able to detect which coding method(s) are used to accurately decode the compressed data.

Though the claimed subject matter is not so limited, combining some of the coding embodiments, variations and examples given above, a possible coding scheme may include:

To code 'e' use 2 2 then move to the first 't' by either EOG-P or wrap by 2. To code the remaining instances of 't' use 3 2 then move to the first 's' by either EOG-P repeated 5 times then a run of 6, or by EOG-J 4 then 6 or by a wrap of 38. There is only one 's' so to move on to 'h' which happens to be the next symbol string in sequence in this example, either use EOG-P then a run of 1, or wrap by 2. There is only one 'h' so to move to the 'space' either use EOG-P three times plus a run of 1, or EOG-J 2 plus a run of 1, or wrap by 18. Finally after coding the 'space', to jump over the remaining 16 letters of the alphabet, repeat EOG-P 17 times, or use EOG-J 16 or wrap by 132. Again, this is merely an example of one way of combining different embodiments, variations and examples discussed. Many others are possible and the claimed subject matter is not intended to be so limited.

Making choices from the alternatives given above, it is seen that a possible efficient code might be:

| 2 2 EOG-P | 0 3 2 EOG-J 4 | 6 | 2 EOG-J 2 | 3 EOG-J 16 |
|---|---|---|---|---|
| Scan for e | Scan for t | Scan for s | Scan for h | Scan for 'space' |

This, of course, is a short example which nonetheless demonstrates the versatility of this method. Further, another variation might be that a wrap of 38 might be used in place of EOG-J 4 plus the run of 6 after coding 't', and equally an EOG-P might have been used after 's' in which case the next symbol would have been 1 instead of the 'wrapping' run of 2.

It is possible that when a new symbol string occurs, either after an EOG-P, EOG-J or by wrapping around, the decoder may not know what the next symbol string is to be, for example if the sequence of symbol strings to be coded has not been predetermined. The identity of the new symbol might be coded is as soon as the need arises. This, however, is but one possibility and the method is not to be limited in this respect. For example, the entire communication could be carried out without knowing what the symbol strings are, the decoder simply assigning its own choice of temporary tokens to be substituted with actual symbol strings at some future time.

Before returning to examples showing possible situations in which a coder might decide to use each of the available methods of coding the end of a symbol string group, some further improvements to the Run Length Coding are first described and illustrated using EOG-P and EOG-J.

Compression may be improved still further by an embodiment analogous to "significance switching." More specifically, here, for each successive symbol string that is coded, positions to be coded become fewer as more and more symbol strings become determined by position. This additional information regarding position may be employed to provide additional compression.

In the present example, as the positions of symbol string 'e' become known, for example, these positions may be omitted as possible positions for later symbol strings. In effect, for the purpose of coding, how many unknown positions are to be skipped is coded, rather than total positions to be skipped, thereby providing additional compression. Without Run Length Coding, in this example, this may be:

| 0010 0100 | 10x0 1x01 | x0x0 xx1x | x1x0 xxxx | xxx1 xxxx |
|---|---|---|---|---|
| Scan for e | Scan for t | Scan for s | Scan for h | Scan for 'space' |

In this particular embodiment, the symbol x here indicates a position that is already known and so does not have to be signalled. The total number of '0''s and '1''s is reduced, from 40 to 20, and as a Run Length Code this is further reduced. Using the EOG-P and EOG-J methods, the code may become:

| 2 2 EOG-P | 0 2 1 EOG-J 4 | 2 EOG-P | 0 EOG-J 2 | 0 EOG-J 16 |
|---|---|---|---|---|
| Scan for e | Scan for t | Scan for s | Scan for h | Scan for 'space' |

In one embodiment, to avoid the symbol 16, an additional rule may be introduced which indicates the end of this segment (partition, block) of data. Possibly this could be yet another symbol meaning End of Data (EOD), or conveniently two successive EOG-J symbols might serve the same purpose. These are but two possibilities and the current invention is not so limited. This might make the current example using only EOG symbols:

| 2 2 EOG-P | 0 2 1 EOG-J 4 | 2 EOG-P | 0 EOG-J 2 | 0 EOG-J EOD |
|---|---|---|---|---|
| Scan for e | Scan for t | Scan for s | Scan for h | Scan for 'space' |
| Or | | | | |
| 2 2 EOG-P | 0 2 1 EOG-J 4 | 2 EOG-P | 0 EOG-J 2 | 0 EOG-J EOG-J |
| Scan for e | Scan for t | Scan for s | Scan for h | Scan for 'space' |

Alternatively, in another embodiment, the wraparound method may be used with skipping of known data everywhere except to terminate the data partition. To use it with efficiency, in the formulas given previously, the data length L may be interpreted as being the number of data symbols in the data grouping that have not yet been coded. The scan for 'e' is unaffected, as is the run of 2 to reach the first 't'. Then as the 'e' symbol strings already coded can be skipped automatically, the runs to get the next instances of 't' are again reduced. Once 't' is finished, 5 of the 8 symbols are known, or put another way, there are only three unknown symbols to skip in each jump over the data. Therefore to get to the 'h' a run of 12+2 skips the data 4 times and moves over two unknown position to reach the 's', total 14. Now there are only two unknown positions. A run of 0 reaches the 'h' and leaves only one unknown so that a run of only 2 skips the unused symbol strings 'r' and 'd' to complete the coding which is finally terminated by two EOG-J symbol string codes:

| 2 2 | 2 2 1 | 14 | 0 | 2 EOG-J EOG-J |
|---|---|---|---|---|
| Scan for e | Scan for t | Scan for s | Scan for h | Scan for 'space' |

And finally by making a further considered choice from all the methods:

| 2 2 | 2 2 1 EOG-J 4 | 2 EOG-P | 0 | 2 EOG-J EOG-J |
|---|---|---|---|---|
| Scan for e | Scan for t | Scan for s | Scan for h | Scan for 'space' |

The above is of course not the only choice and the claimed methods should not be limited by this example. The desired end code for a given symbol string can depend on the statistics of that data being coded, which likely varies application by application. Accordingly, again, this is but one example showing some choices. Other choices can be made within this example. Other embodiments are within the scope of the claimed subject matter. Other examples are possible and different manners of adaptively coding data result from using different combinations of the various possible embodiments.

By making different methods of signalling the end of a symbol string group available to a coder, better coding efficiency may be obtained, in many cases. Of course, it is advantageous for a corresponding decoder to be able to recognize the coding variations used. For example, this may be achieved by having the different methods each signalled by a distinctive symbol string code, such as, either EOG-P, or EOG-J, or a position normally given by a run length that moves beyond the end of the data set.

The design of the symbol string codes may vary based upon the type of coding used. For example, if made by a hybrid of adaptive Huffman and Golomb coding, pure Huffman Codes might be used for EOG-P and EOG-J, and Golomb codes with a Huffman Exponent might be used for Run Length codes. If the Huffman part is adaptive, then by repeated use, certain codes will achieve very short code word lengths. This is but one instance of how the invention might be implemented and the claimed subject matter is not limited by any particular method of forming symbol string codes.

Each method of signalling the end of a symbol string group has its strengths and weaknesses. The EOG-P method may be very efficient if the data is not unduly sparse so that at least most of the symbol strings occur within the data, but in such a way that there is a bias towards one part of the data as would happen for example in coded truncated coefficients after a wavelet or Discrete Cosine Transform. In such a case, the EOG-P symbol may become as short as one bit and therefore be very efficient. However, with sparse data, repetition of EOG-P to skip over groups may not be efficient and EOG-J may be more efficient. Conversely, with quite dense data, the EOG-P symbol may not have a short code as some run lengths may occur more frequently. So, in some circumstance, it may not be efficient and in this case Wraparound might, for example, be more efficient.

From the above discussion, it can be appreciated that EOG-J may be suited to situations where the data is sparse and many symbol string groups are jumped. The Wraparound method may be suited to cases where the data is relatively dense and symbol string groups are seldom jumped, so that the run length that wraps the position from a position near the end of a particular symbol string group into a position near the beginning of the next symbol string group may be efficiently coded.

As shown in the above example, in an embodiment, the use of MERGE coding with alternative methods of terminating MERGE groups is a versatile method of data compression. In this embodiment, it can be seen that most or all data compression tasks may be expressed through the MERGE method, by employing entirely, or at least mostly, Run Length Coding. It may be advantageous to employ efficient run length coding methods. These could be arithmetic coding as widely known in the field, with the disadvantage of high complexity and coding delay, or Golomb coding, perhaps as hybridized with Huffman coding. Other methods of Run Length Coding already known or yet to be disclosed could be used and the present claimed subject matter is not to be limited in this respect.

Furthermore, once the coder comes to the final symbol string to be coded, its positions may be determined without communicating or coding any additional information. More specifically, in this example embodiment, this symbol string occupies positions not previously signalled or coded. However, this assumes the length of the set of data being coded is known. Suppose it were known that 'space' would be the last symbol string to be sent. If so, after the end code EOG-J 2 to terminate symbol string 'h' is finished, all remaining symbol strings in this example are implicitly 'space' and the process may terminate without additional coding or communication.

In the given example, therefore, assuming it is known that 'space' is the final symbol string, additional compression may be obtained as follows:

| 2 2 EOG-P | 0 2 1 EOG-J 4 | 2 EOG-P | 0 EOG-J | 2 |
|---|---|---|---|---|
| Scan for e | Scan for t | Scan for s | Scan for h | Scan for 'space' |

Or using only the Wraparound method:

| 2 2 | 2 2 1 | 14 | 0 | EOG-J EOG-J |
|---|---|---|---|---|
| Scan for e | Scan for t | Scan for s | Scan for h | Scan for 'space' |

Or by making a considered choice from all the methods:

| 2 2 | 2 2 1 EOG-J 4 | 2 EOG-P | 0 | EOG-J EOG-J |
|---|---|---|---|---|
| Scan for e | Scan for t | Scan for s | Scan for h | Scan for 'space' |

And of course, further methods are possible within the scope of the claimed subject matter.

In different embodiments, the EOG-J symbol may be used in a situation where there are no empty symbol string groups. This would involve sending EOG-J followed by the code for 0. This would have the same effect as sending just EOG-P. It can happen at some particular stage in using an adaptive coder that the codes for EOG-J plus '0' are together shorter than the code for EOG-P. A coder taking a short term view might choose to send EOG-J 0. However doing so may affect the longer term compression of the coder, by reducing the frequency of occurrence of EOG-P and preventing the coding process from adjusting the length of EOG-P. Repeatedly using EOG-J 0 in place of EOG-P may eventually result in EOG-P having a longer code than it would otherwise have, and this may not be as efficient. So, for some embodiments, it may be more efficient in the design of a coder to avoid the use of EOG-J followed by 0.

Another possibility in a further embodiment is that EOG-J is followed by a negative number causing it to jump backwards through the order of symbol strings. It is possible in a very sophisticated coder that some advantage might be gained. For example, the total length of jumps may be reduced by devising a complicated revision of a predetermined order of symbol strings. Or as another example, it may occur that multiple data items occupy the same position so that the coder could decide to revisit a group.

It is possible that when the end of a group is determined by whichever method, the decoder may not know what the next symbol string is to be for example if the sequence of symbol strings to be coded has not been predetermined. The identity of the new symbol may be coded is as soon as the end of group occurs. This however is but one possibility and the method is not to be limited in this respect. For example, the entire communication may be carried out without knowing what the symbol strings are, the decoder simply assigning its own choice of temporary tokens to be substituted with actual symbol strings at some future time.

However, it may also be desirable in some circumstances to employ a similar approach if the length of a set of data and/or number of symbol strings is not known. Various approaches are possible in situations where the length of a set of data being coded, for example, is not known and claimed subject matter is not limited in scope to a particular approach. For example, this might be handled by having a standard length. Alternately, length information may be prefixed to coded information. However, if multiple sets of data are being coded and most have the same length, to prefix length would be inefficient from a compression standpoint. Likewise, continuing with this notion, for a long communication of data, if a standard length is employed to sub-divide the data, variation from a standard length may be handled by communicating or coding a set of data at the end smaller than the standard length.

One example embodiment of a method may include partitioning the total length of a data set before coding. If there is a standard partition length, the coder and decoder may determine how many partitions there are, and the length of final partition if it is less than the standard length. For example, if a set of data 102 symbol strings long is being coded and the standard length of a partition is 5, then 21 partitions are present with the final one having a length of 2. Again, as previously alluded to, the total length may be included in the data code in many ways and the examples given are not intended to be restrictive. Claimed subject matter is intended to include these example approaches as well as other possible approaches.

Likewise, several approaches are also possible with respect to handling symbol strings. For example, as previously illustrated, a predetermined order of symbol strings may be employed. However, alternately, symbol strings may be ordered relative to their frequency of occurrence if known or capable of being determined or approximated. For example, using English simply as an example, this might the following order: 'e' 't' 'a' 'o' 'i' 'n' 's' 'h' and so on. A "space" may be included in such an order as its statistics indicate in a sample. Also, there may be symbol strings that do not occur, which may form an empty symbol string group to be signalled. With such an approach, both the coder and the decoder have an order of symbol strings. Accordingly, if a decoder receives an EOG-P or EOG-J followed by a code indicating how many symbol strings to jump, for example, it is able to determine the next appropriate symbol string. Similarly a symbol string code may specify a large wraparound that indicates how many symbol strings to jump, for example, so that a decoder is able to determine the next appropriate symbol string.

Another approach in another embodiment may be to explicitly prefix a set of data, for example, with a symbol string. Likewise, a symbol string may alternately be post-fixed or otherwise embedded so that a decoder may make appropriate determinations from coded data. It is likewise possible that a system may employ two modes, one in which a predetermined order of symbol strings is communicated and another in which symbol strings are prefixed or otherwise embedded. These modes may occur in any order and mode switching may be indicated, in one example, by a special symbol used for that purpose.

In still another possible embodiment, a coder and decoder may adopt a method of constructing new symbol strings from symbol strings already received. This level of flexibility may permit an encoder to select or change symbol strings and modes of communication to improve compression. For example, it might well be the case that not all predefined symbol strings are used, in which case, to avoid signalling a large number of empty groups by repeating the EOG-P symbol, there might be a new symbol string which signals No More Groups, effectively meaning End of Data or End of Data, for example. This possibility was introduced above as was the possibility that two successive occurrences of the EOG-J symbol might serve this purpose.

In many situations, side information might accompany a data set. For example, such side information may comprise text, font, size, weight, colour and/or style. The side information may be communicated or coded any number of ways. For example, side information may be embedded with a run length, or inserted in coded data in any position so that a decoder may appropriately associate it with a symbol string. In one embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches, if desired.

Figure 2:
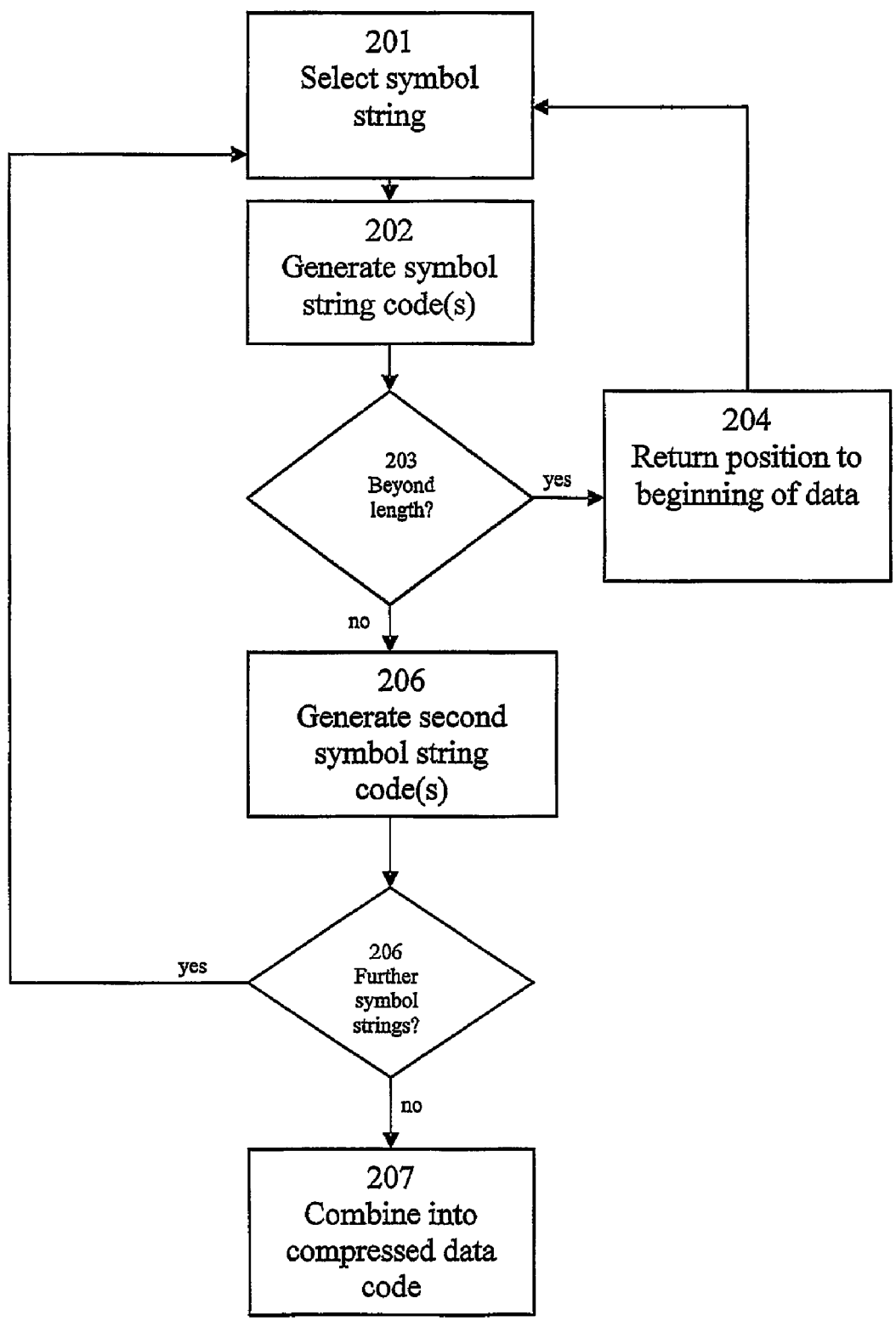
FIG. 2 is a flow chart illustrating an example embodiment of a method for coding data in accordance with claimed subject matter.

FIG. 2 is a flowchart depicting one embodiment. At 201 a symbol string that occurs within the data to be compressed may be selected. At 202 a symbol string codes indicative of one or more positions of the symbol string within the grouping of data may be generated. A determination may be made at 203 that if the symbol string code indicates a position beyond the length of the data, at 204, the position is returned to the beginning of the data, at least partially in response to the symbol string code, and at 201, select a new symbol string with a first position of the new symbol string determined based at least in part upon a length of the data and the position. If at 203 the symbol string code does not indicate a position beyond the length of the data, then at 205 a second symbol string code indicative that there are no more occurrences of the symbol string and/or that one or more other symbol strings is not to be selected may be generated. At 206 the flow may repeat successively if there are further symbol strings that occur within the grouping and which have not been identified as not to be selected, by returning to 201. Finally, at 207, respective symbol string codes may be combined into a compressed data code. An embodiment in accordance with claimed subject matter may include all, more than all or less than all of blocks 201-207. Furthermore, the order of blocks 201-207 is merely one example order, and the scope of the claimed subject matter is not limited in this respect.

Figure 3:
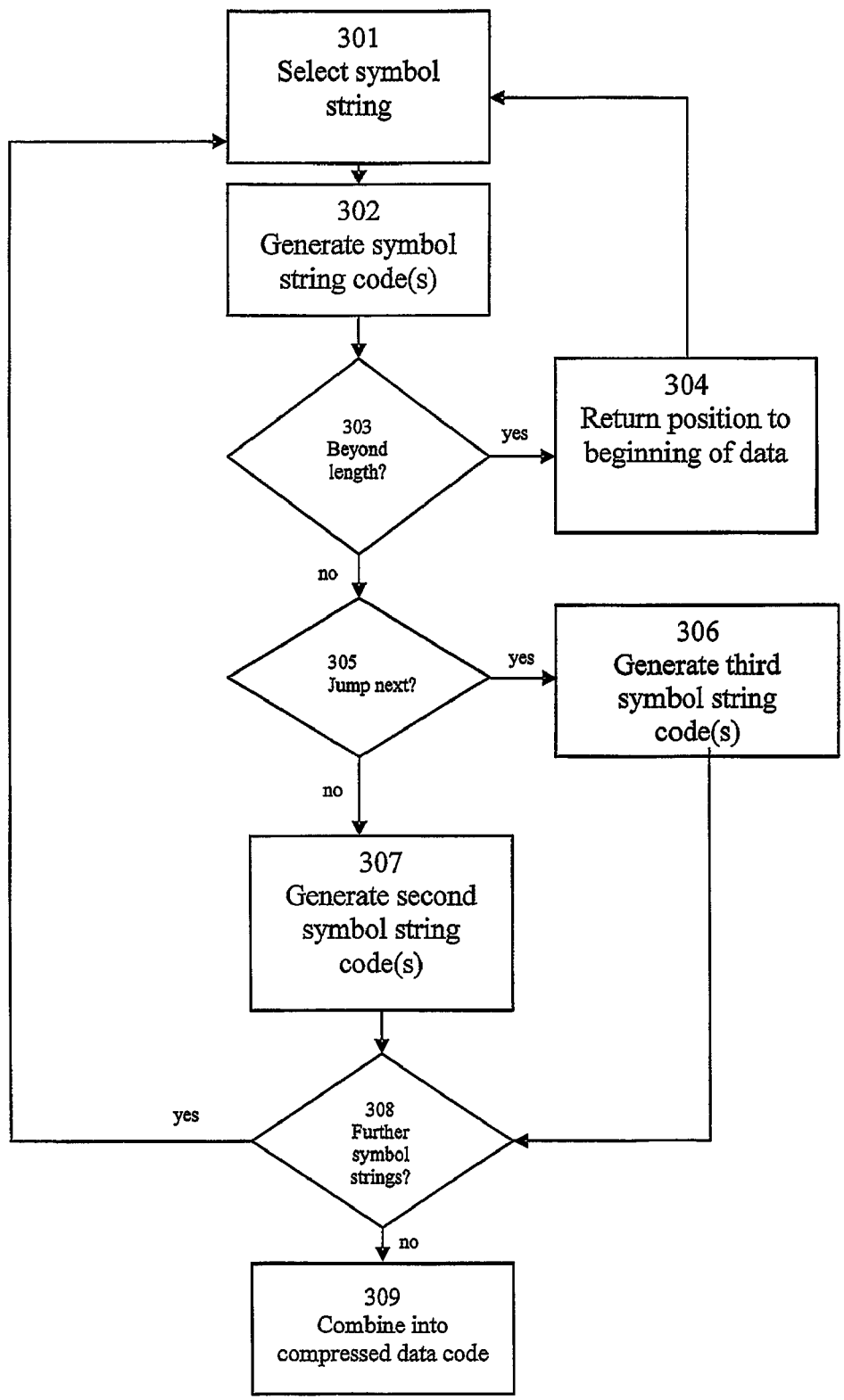
FIG. 3 is a flow chart illustrating an example embodiment of a method for coding data in accordance with claimed subject matter.

FIG. 3 is a flowchart depicting one embodiment. At 301 a symbol string that occurs within the data to be compressed may be selected. At 302 a symbol string code indicative of one or more positions of the symbol string within the grouping of data may be generated. A determination may be made at 303 that if the symbol string code indicates a position beyond the length of the data, at 304, the position may be returned to the beginning of the data, at least partially in response to the symbol string code, and at 301, a new symbol string with a first position of the new symbol string determined based at least in part upon a length of the data and the position may be selected. If at 303 the symbol string code does not indicate a position beyond the length of the data, then at 305, where the next symbol string is to be jumped, at 306 a third symbol string code indicative that there are no more occurrences of the symbol string and that one or more other symbol strings is not to be selected may be generated. If at 305, the next symbol string is not to be jumped, at 307, a second symbol string code indicative of the end of the symbol string and that the following symbol string is to be selected may be generated. At 308 the flow may repeat successively if there are further symbol strings that occur within the grouping and which have not been identified as not to be selected, by returning to 301. Finally, at 309, respective symbol string codes may be combined into a compressed data code. An embodiment in accordance with claimed subject matter may include all, more than all or less than all of blocks 301-309. Furthermore, the order of blocks 301-309 is merely one example order, and the scope of the claimed subject matter is not limited in this respect.

Of course, claimed subject matter is not limited to the examples in FIG. 2 or FIG. 3 or to any one particular embodiment. These examples are simply an illustration for explanatory purposes. Many other potential embodiments are intended to be included within the scope of claimed subject matter.

Embodiments in accordance with claimed subject matter may be applied to coding of data of all types, including non-numeric data, such as symbolic data, for example, converted into numerical form by any convenient mapping prior to application of coding. As is noted, embodiments perform well for run length coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction by a decoder at the far end. Likewise, alternatively, in another embodiment in accordance with claimed subject matter coded data may be stored rather than transmitted. Thus, claimed subject matter is intended to cover these as well as other embodiments.

Figure 4:
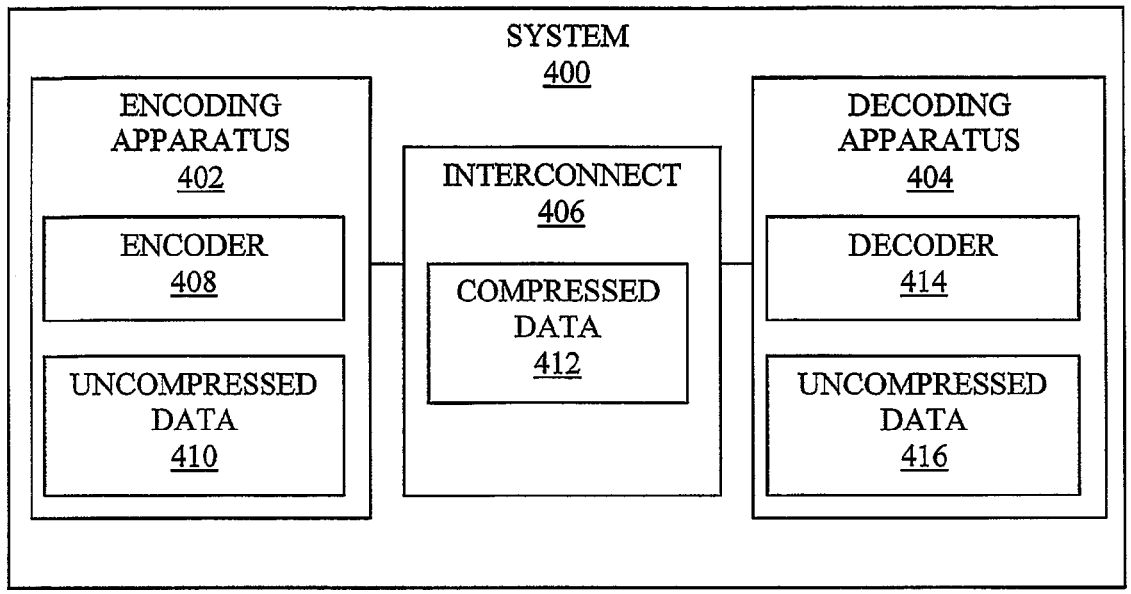
FIG. 4 is a block diagram illustrating an example embodiment of a system in accordance with claimed subject matter.

FIG. 4 is a block diagram illustrating an embodiment of a system 400 an encoding apparatus 402 and decoding apparatus 404 in accordance with the claimed subject matter. In one embodiment, system 400 may include encoding apparatus 402, decoding apparatus 404 and a interconnect 406. Alternatively or additionally, communication may not be over interconnect 406. For example, system 400 may have encoding apparatus 402 and decoding apparatus 404 located within a single device and perform communications within the device.

In one embodiment, encoding apparatus 402 may include an encoder 408 which may be capable of performing one or more embodiments as described above and illustrated in FIGS. 1, 2 and/or 3. Encoder 408 may take uncompressed data 410 and encode it, or a portion of it, into compressed data 412. In one embodiment, encoding apparatus 402 may transmit compressed data 412 to decoding apparatus 404, such as within a single device, over a network, and/or the like.

In one embodiment, decoding apparatus 404 may include a decoder 414, which may be capable of performing the reverse of the embodiment as described above and illustrated in FIGS. 1, 2 and/or 3. For example, decoder 414 may be capable of decoding data encoded according to the technique described above and illustrated in FIGS. 2 and/or 3. Decoder 414 may take compressed data 412 and decode it, or a portion of it, into uncompressed data 416. System 400 described above is not limited to any particular hardware or software configuration and all or part of system 400 may find applicability in any computing or processing environment such as is described below in FIG. 5, for example.

Figure 5:
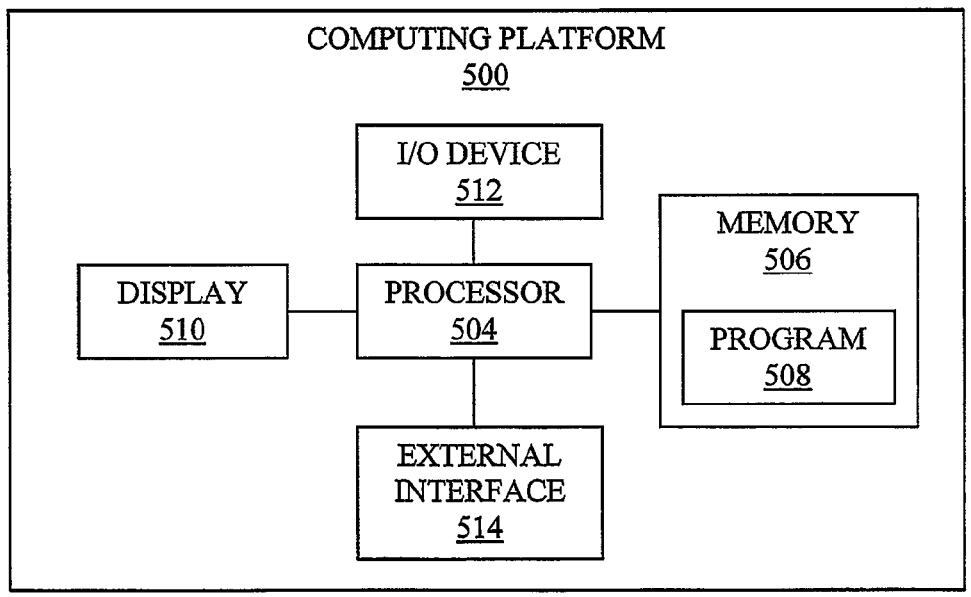
FIG. 5 is a block diagram of an example embodiment of a computing platform in accordance with claimed subject matter.

Referring to FIG. 5, a block diagram of a computing platform 500 according to one or more embodiments is illustrated, although the scope of claimed subject matter is not limited in this respect. Computing platform 500 may include more and/or fewer components than those shown in FIG. 5. However, generally conventional components may not be shown, for example, a battery, a bus, and so on.

Computing platform 500, as shown in FIG. 5 may be utilized to embody tangibly a computer program and/or graphical user interface by providing hardware components on which the computer program and/or graphical user interface may be executed. Computing platform 500 may be utilized to embody tangibly all or a portion of FIG. 2, FIG. 3 and/or other procedures disclosed herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 5, computing platform 500 may be controlled by processor 504, including one or more auxiliary processors (not shown). Processor 504 may comprise a central processing unit such as a microprocessor or microcontroller for executing programs, performing data manipulations, and controlling the tasks of computing platform 500. Auxiliary processors may manage input/output, perform floating point mathematical operations, manage digital signals, perform fast execution of signal processing algorithms, operate as a back-end processor and/or a slave-type processor subordinate to processor 504, operate as an additional microprocessor and/or controller for dual and/or multiple processor systems, and/or operate as a coprocessor and/or additional processor. Such auxiliary processors may be discrete processors and/or may be arranged in the same package as processor 504, for example, in a multicore and/or multithreaded processor; however, the scope of the scope of claimed subject matter is not limited in these respects.

Communication with processor 504 may be implemented via a bus (not shown) for transferring information among the components of computing platform 500. A bus may include a data channel for facilitating information transfer between storage and other peripheral components of computing platform 500. A bus further may provide a set of signals utilized for communication with processor 504, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 500 may include, for example, memory 506, including one or more auxiliary memories (not shown). Memory 506 may provide storage of instructions and data for one or more programs 508 to be executed by processor 504, such as all or a portion of FIG. 2, FIG. 3 and/or other procedures disclosed herein, for example. Memory 506 may comprise, for example, semiconductor-based memory such as dynamic random access memory (DRAM) and/or static random access memory (SRAM), and/or the like. Other semi-conductor-based memory types may include, for example, synchronous dynamic random access memory (SDRAM), Rambus dynamic random access memory (RDRAM), ferroelectric random access memory (FRAM), and so on. Alternatively or additionally, memory 506 may comprise, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 806 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 500 further may include a display 510. Display 510 may comprise a video display adapter having components, including, for example, video memory, a buffer, and/or a graphics engine. Such video memory may comprise, for example, video random access memory (VRAM), synchronous graphics random access memory (SGRAM), windows random access memory (WRAM), and/or the like. Display 510 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 500 further may include one or more I/O devices 512. I/O device 512 may comprise one or more I/O devices 512 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 500 further may include an external interface 514. External interface 514 may comprise one or more controllers and/or adapters to prove interface functions between multiple I/O devices 512. For example, external interface 514 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 512.

It will, of course, be understood that, although particular embodiments have just been described, the claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method comprising:
identifying, with a processor of an encoding device, a first symbol string that occurs within data to be compressed;
generating a first symbol string code indicative of one or more positions of the first symbol string within the data;
generating a symbol configured to indicate that there are no more occurrences of the first symbol string, wherein the symbol identifies at least one of a number of symbol strings to skip in an ordered list of symbol strings before generating a second symbol string code or the symbol identifies a position beyond a length of the data that corresponds to a first position of a second symbol string within the data; and
combining the first symbol string code with one or more additional symbol string codes to generate a compressed data code corresponding to the data.

2. The method of claim 1, wherein the symbol strings to skip follow the first symbol string.

3. The method of claim 1, wherein the symbol strings to skip precede the first symbol string.

4. The method of claim 1, further comprising:
identifying a second symbol string to encode by skipping over the number of symbol strings to skip; and
generating a second symbol code indicative of one or more positions of the second symbol string, wherein the compressed data code includes a combination of at least the first symbol string code and the second symbol string code.

5. The method of claim 1, further comprising determining one or more distances between one or more occurrences of the first symbol string, wherein the first symbol string code is based at least in part on the one or more distances.

6. The method of claim 1, wherein the first symbol string code identifies one or more positions in the data where the first symbol string does not occur.

7. The method of claim 1, wherein the compressed data code does not include one or more positions of a final symbol string.

8. The method of claim 1, wherein the first symbol string comprises an initial symbol string of the data.

9. The method of claim 1, wherein the first symbol string is identified based on a predetermined ordered list of symbol strings.

10. The method of claim 1, wherein the symbol is part of the first symbol string.

11. The method of claim 1, wherein the symbol comprises a second symbol string.

12. An apparatus comprising:
a memory; and
a processor operatively coupled to the memory and configured to:
identify a first symbol string that occurs within data to be compressed;
generate a first symbol string code indicative of one or more positions of the first symbol string within the data, wherein the first symbol string code includes a symbol configured to indicate that there are no more occurrences of the first symbol string, and wherein the symbol identifies at least one of a number of symbol strings to skip in an ordered list of symbol strings before generating a second symbol string code or the symbol identifies a position beyond a length of the data that corresponds to a first position of a second symbol string within the data; and
combine the first symbol string code with one or more additional symbol string codes to generate a compressed data code corresponding to the data.

13. The apparatus of claim 12, wherein the ordered list of symbol strings is known to the apparatus and to a decoder in communication with the apparatus.

14. The apparatus of claim 12, wherein the position beyond the length of the data wraps around the data one or more times to skip one or more symbol strings.

15. The apparatus of claim 12, wherein the processor is further configured to determine one or more distances between one or more occurrences of the first symbol string, wherein the first symbol string code is based at least in part on the one or more distances.

16. The apparatus of claim 12, further comprising a transmitter operatively coupled to the processor and configured to transmit the compressed data code to a decoder.

17. The apparatus of claim 12, wherein the processor is further configured to identify the first symbol string based at least in part on a frequency of occurrence of the first symbol string.

18. The apparatus of claim 17, wherein the frequency of occurrence is relative to the data.

19. The apparatus of claim 17, wherein the frequency of occurrence is relative to usage of the first symbol string in a language.

20. An apparatus comprising:
means for identifying a first symbol string that occurs within data to be compressed;
means for generating a first symbol string code indicative of one or more positions of the first symbol string within the data;
means for generating a symbol configured to indicate that there are no more occurrences of the first symbol string in the data, wherein the symbol identifies at least one of a number of symbol strings to skin in an ordered list of symbol strings before generating a second symbol string code or the symbol identifies a position beyond a length of the data that corresponds to a first position of a second symbol string within the data; and
means for combining the first symbol string code with one or more additional symbol string codes to generate a compressed data code corresponding to the data.

21. The apparatus of claim 20, further comprising means for transmitting the compressed data code to a decoder.

22. The apparatus of claim 20, wherein the symbol indicates that a second symbol string is to be coded, and wherein the second symbol string is a subsequent symbol string in an ordered list of symbol strings.

23. The apparatus of claim 20, further comprising means for determining one or more distances between one or more occurrences of the first symbol string, wherein the first symbol string code is based at least in part on the one or more distances.

24. A tangible computer-readable medium having stored thereon, computer-executable instructions that, if executed by a computing device, cause the computing device to perform a method comprising:
identifying a first symbol string that occurs within data to be compressed;
generating a first symbol string code indicative of one or more positions of the first symbol string within the data, wherein the first symbol string code includes a symbol configured to indicate that there are no more occurrences of the first symbol string, and wherein the symbol identifies at least one of a number of symbol strings to skip in an ordered list of symbol strings before generating a second symbol string code or the symbol identifies a position beyond a length of the data that corresponds to a first position of a second symbol string within the data: and
combining the first symbol string code with one or more additional symbol string codes to generate a compressed data code corresponding to the data.

25. The tangible computer-readable medium of claim 24, further comprising identifying a second symbol string to encode by skipping over the number of symbol strings to skip.

26. The tangible computer-readable medium of claim 24, wherein the symbol indicates that a second symbol string is to be coded, and wherein the second symbol string is a subsequent symbol string in an ordered list of symbol strings.

27. The tangible computer-readable medium of claim 24, wherein the position beyond the length of the data wraps around the data one or more times to skip one or more symbol strings.

28. A method comprising:
receiving, at a decoding device having a processor, a compressed data code corresponding to data, wherein the compressed data code includes a plurality of symbol string codes corresponding to a plurality of symbol strings;
identifying, based on a first symbol string code of the plurality of symbol string codes, one or more positions of a first symbol string in the data; and
identifying a second symbol string to decode based at least in part on a symbol in the compressed data code, wherein the symbol is configured to indicate that there are no more occurrences of the first symbol string.

29. The method of claim 28, wherein the symbol identifies a number of symbol strings to skip in an ordered list of symbol strings.

30. The method of claim 28, wherein the symbol is part of the first symbol string code.

31. The method of claim 28, further comprising identifying one or more positions of the second symbol string in the data based at least in part on a second symbol string code of the plurality of symbol string codes.

32. The method of claim 28, wherein the symbol identifies a position beyond a length of the data, and wherein the position corresponds to a first position of the second symbol string within the data.

33. The method of claim 28, wherein the first symbol string code is based at least in part on one or more distances between occurrences of the first symbol string within the data.

34. An apparatus comprising:
- a receiver configured to receive a compressed data code corresponding to data, wherein the compressed data code includes a plurality of symbol string codes corresponding to a plurality of symbol strings; and
- a processor operatively coupled to the receiver and configured to:
  - identify, based on a first symbol string code of the plurality of symbol string codes, one or more positions of a first symbol string in the data; and
  - identify a second symbol string to decode based at least in part on a symbol in the compressed data code, wherein the symbol is configured to at least indicate that there are no more occurrences of the first symbol string.

35. The apparatus of claim 34, wherein the processor is further configured to identify one or more positions of the second symbol string in the data based at least in part on a second symbol string code of the plurality of symbol string codes.

36. The apparatus of claim 34, wherein the symbol identifies a number of symbol strings to skip in an ordered list of symbol strings.

37. The apparatus of claim 36, wherein the receiver is further configured to receive the ordered list of symbol strings.

38. The apparatus of claim 34, wherein the symbol identifies a position beyond a length of the data, wherein the position corresponds to a first position of the second symbol string within the data.

* * * * *